United States Patent [19]

Firman et al.

[11] Patent Number: 5,038,051
[45] Date of Patent: Aug. 6, 1991

[54] SOLID STATE MODULATOR FOR MICROWAVE TRANSMITTERS

[75] Inventors: Jeffrey C. Firman, Ellicott City; Richard E. Rouse, Westminister; William H. Zinger, Columbia, all of Md.

[73] Assignee: The United States of America as represented by the Secretary of the Navy, Washington, D.C.

[21] Appl. No.: 608,297

[22] Filed: May 8, 1984

[51] Int. Cl.$^5$ .................. H03K 3/01; H03K 17/60
[52] U.S. Cl. .................. 307/106; 307/254; 332/110; 332/113; 332/106
[58] Field of Search .......... 331/87, 173, 185, 186; 332/9 R, 9 T, 12, 110, 113, 106; 342/175; 307/570, 571, 254

[56] References Cited

U.S. PATENT DOCUMENTS

| | | | |
|---|---|---|---|
| 2,595,301 | 5/1952 | Sager | 250/17 |
| 2,597,013 | 5/1952 | Marchetti | 250/17 |
| 4,283,790 | 8/1981 | Clock et al. | 375/71 |
| 4,303,841 | 12/1981 | Baker | 307/570 |
| 4,329,600 | 5/1982 | Stewart | 307/540 |
| 4,329,705 | 5/1982 | Baker | 357/43 |
| 4,336,538 | 6/1982 | Radford | 342/175 |
| 4,356,457 | 10/1982 | DiCarlo | 332/3 |
| 4,367,421 | 1/1983 | Baker | 307/570 |

Primary Examiner—John B. Sotomayor
Attorney, Agent, or Firm—Kenneth E. Walden

[57] ABSTRACT

A switching modulator for a microwave radar transmitter is presented. In one embodiment, a string of series connected transistors is controlled from an external source for pulse modulating the cathodes of transmitter microwave tubes. The individual components of the series string can be individually switched ON or OFF in order to maintain regulation of the modulation pulse. In a second embodiment, a pulse transformer has a plurality of individual primary windings and a single secondary winding wherein the primary windings are specially wound to provide isolation between the primary windings with the flux in the secondary winding and the voltage generated in the secondary winding being proportional to the sum of the excitation of the primary windings. Each of the primary windings are individually switchable for regulating the generated output voltage at the secondary winding.

9 Claims, 2 Drawing Sheets

SOLID STATE MODULATOR FOR MICROWAVE TRANSMITTERS

BACKGROUND OF THE INVENTION

The present invention relates to solid state modulators and more particularly to pulse modulators for microwave radar transmitters Typically, for high powered systems, the transmitter is modulated by a high powered vacuum tube typically a tetrode switch tube. Such a tetrode switch tube suffers from the disadvantages of low efficiency, a long warm up period, and large standby power consumption. Typically for example, for each 1 KW average RF power output, approximately 1.2 KW average power is dissipated by each tetrode switch tube in a 0.008 duty cycle. Additionally, such tubes have the disadvantages of short lifetimes and the necessity for high voltage power supply in order of 17 KVDC requiring high voltage power supplies which are bulky, and require high voltage protective circuitry and specialized high voltage components.

Most crossed-field microwave tubes used in such radar transmitters require a high voltage constant current cathode pulse for proper operation. The tetrode switch tubes are often used for generating such a modulated cathode pulse by applying a large negative voltage pulse to the cathode of the microwave tube. The modulator most commonly used is the soft tube line type. However, line type modulators are limited in their ability to operate with large variations in pulse width. Where large variations in pulse width or spacing are required, a vacuum (hard) switch tube is usually used. For such cases the crossed-field amplifiers (CFA) are modulated by a large tetrode switch tube. The switch tube not only forms the cathode voltage pulse but provides constant current regulation for the top of the pulse. This constant current regulation compensates for variations in power supply voltage and for variations in the impedance of the CFA with RF frequency. To provide sufficient dynamic range for the constant current regulation, a sizeable voltage drop must be maintained across the switch tube and this results in significant power dissipation in the switch tubes which reduces the overall transmitter efficiency. For example, for each 1 KW of RF output power, 1.3 KW is dissipated in the CFA anode, 0.7 KW is dissipated in the switch tube anode and, 0.75 KW is used in the switch tube heater. Thus, more power is dissipated in the switch tube then is converted to RF. The overall efficiency of the transmitter can be greatly improved and the other disadvantages overcome if a more efficient switching system and a non-dissipative constant current regulator is used.

Solid state devices provide high efficiency switching and good reliability. Such devices also provide instant turn on and simplified circuitry. To date, many high power solid state modulators have used avalanche devices, such as SCR's, triacs, etc. However, avalanche devices are difficult and relatively slow to turn-off. Transistors having sufficient switching speed and power capability have not been available at low cost to make a high power all transistor modulator practical for the powers expressed herein. However, power MOSFET transistors capable of switching 50 amperes at 500 volts (25 kw) at 50 nanoseconds have recently become available at reasonable cost. For a CFA requiring 13 kv, 23 ampere (300 kw) pulse, 20 power FET's can provide sufficient pulse power to operate such a CFA since twenty transistors cost less than one switch tube. Thus, for high power CFA's on the order of 1.0–1.25 MW with higher voltage requirements of the order of 40 KV, such solid state modulators are lighter, cheaper and capable of switching larger amounts of power at high duty cycles with greater efficiency than would otherwise be practicable.

SUMMARY OF THE INVENTION

Briefly, the present invention relates to a switching modulator for microwave radar transmitting tubes. In one embodiment of the present invention, a string of series connected field effect power transistors is controlled from an external source for pulse modulating the modulator transmitter tubes. Protective circuitry is included and the individual components of the string can be individually switched ON or OFF in order to maintain regulation of the produced modulation pulse. In a second embodiment, a pulse transformer is used which has a plurality of primary windings and a single secondary winding connectable to the transmitter tube. The transformer is provided with a plurality of primary windings which is specially wound to provide isolation between each or the other primary windings with the flux in the secondary winding and the voltage generated in the secondary winding being the proportional to the sum of excitation of the primary windings. Each of the primary windings are individually switchable by power field effect transistors for regulating the generated output voltage at the secondary winding.

OBJECTS OF THE INVENTION

Accordingly, it is an object of the present invention to provide a modulator for microwave transmitters which is reliable, power efficient, and permits variable duty cycle, and having easier maintenance because of modular design.

Another object of the present invention is to provide a modulator for microwave radar transmitters wherein a string or voltage limiting devices is connected across a respective member of a string of solid state devices which are individually actuatable for providing regulation of the modulator pulse.

Yet another object of the present invention is to provide a modulator for microwave radar transmitters wherein individually actuatable semiconductor switching devices are connected to a respective ones of a primary windings of a modulator transformer wherein the voltage output of the secondary is proportional to the sum of the voltages of the individual primary windings.

Further objects and advantages of the present invention will become apparent as the following description proceeds and features of novelty will be pointed out with particularity in the claims annexed to and forming a part of this specification.

DESCRIPTION OF THE DRAWINGS

For a better understanding of the present invention reference made be had to the accompanying drawings wherein.

DETAILED DESCRIPTION OF THE PREFERRED EMBODIMENT

The present invention provides a solid state modulator having improved efficiency during operation, i.e., 75-200 W power dissipation instead of 1.2 KW power dissipation for a tube modulator, low wasteful consumption of standby power, no warm up period required, improved reliability, a relatively low voltage power supply, and an inherently modular design for easier maintenance.

In the exemplary embodiments, power field effect transistors (FET) are used as switching elements. The powers from a large number of FET's are additive to produce the high voltage pulse for modulating the crossed-field tube. The current in the cross-field tube is regulated by the number or FET's switched on for a given pulse.

Figure 1:
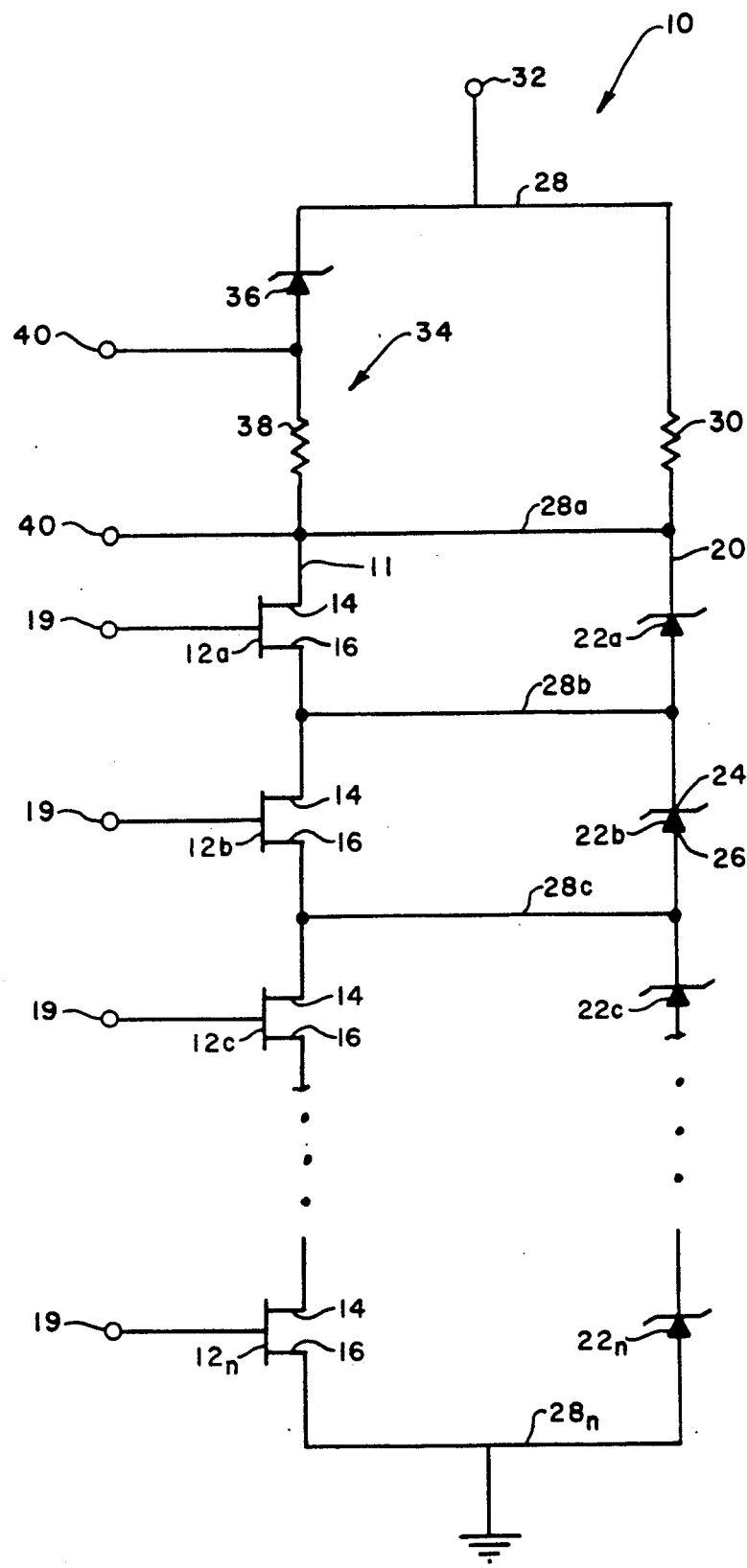
FIG. 1 is a schematic diagram of one embodiment of the present invention.

Referring now to the drawings wherein like reference numerals have been applied to like members, there is shown in FIG. 1 one embodiment of the solid state switching modulator or the present invention, generally designated 10. Modulator 10 comprises a series string 11 of power field effect transistors 12 each having a drain electrode 14, a respective source electrode 16, and a respective gate electrode 18. The transistors 12 are connected in series so that the source or one is connected to the drain of the other and that the conducted current of one will be conducted by an adjacent transistor when both are in the conduction mode. Connected across the series FET string 11 is a series zener diode string 20 which includes a plurality of zener diodes 22 each connected in series with another so that the cathode of one connected to the anode of the other so that one of the zener diodes 22 will conduct current from the adjacent one. Additionally, each individual zener diode 22 is connected across a respective transistor 12 such that the respective zener diode 22, when in the zener or conduction mode, can conduct current derived from either the zener diode 22 ahead of it in the string 20 or the transistor 12 ahead of it in the transistor string 11.

In series with the transistor string 11 and the zener string 20 at node 28 is a current limiting resistor 30 which is connectable at terminal 32 to one plurality of an external power supply (not shown). Also connected in series with transistor string 11 and zener string 20 at node 28 is a series circuit 34 which includes a control zener diode 36 and a connectable load resistor 38. The other end of the transistor string 11 and zener string 20 are connected together at node 28n and are connectable to the other polarity of the external power supply which typically is also be connected to electrical ground.

The electrical state of a field effect transistors is controllable by application of an externally provided voltage at the control electrode 18 and are individually controllable into a non-conductive or OFF state, a conductive or ON state or an intermediate state in between the ON and OFF state.

The operation of the modulator circuit 10 will now be discussed When the transistors are in a non conductive (OFF) state, the voltage across zener diode 36 is less than its zenering voltage and zener diode 36 is also non conducting and in the OFF state. Thus, there is no current through or voltage across load resistor 38. As shown in FIG. 1, load resistor 38 can be a connectable low reactance load resistor, such as the input impedance of the cathode of the CFA or the primary of a pulse transformer in parallel with a circuit connected resistor which may or may not be provided as appropriate. The voltage across series circuit 34 establishes a current path across current limiting resistor 30 and through the voltage limiting zener string 20 to ground. The zener string 20 and the individual zener diodes 22 maintain the proper drain to source voltage across the respective FET transistors 12.

When a particular transistor 12 is turned or triggered into the conductive (ON) state it will substantially short out the respective zener diode 22 connected across the respective transistor since the ON voltage of the transistor is typically of the order of less than 0.5 volts which is less than the zener voltage of the individual zener diodes 22. Accordingly each of the transistors 12 can be individually triggered into a conductive state by application of a signal to the respective gate electrode 19, they can all be triggered into an ON state simultaneously, or some may be triggered into an ON state and some left in an OFF state for regulation as will be discussed in greater detail hereinafter. If all of the transistors 12 or string 11 are triggered into an ON state, the node 28a will be effectively shorted to the ground potential of node 28n causing the voltage across zener diode 36 to exceed its zenering voltage and conduct thus causing current to flow through zener diode 36 and through the low reactance load 38 and through the transistor string 11 to ground. Turning off the string 11 reverses the process by turning off zener diode 36 and once again establishing a current path through resistor current limiting resistor 30 and zener string 20. A voltage transcient exceeding the maximum drain-source voltage of the individual FET's are shunted by the respective zener diode 22 of the zener string 20.

The voltage across the low reactance load 38 can be regulated by varying the number of transistors 12 simultaneously switched into the ON state and still causing conduction of zener diode 36. When a transistor 12 is not switched ON during a pulse, pulse current flows through its respective protective zener diode 22 and the voltage across load 38 drops by the amount of voltage appearing across that particular zener diode 22. Similarly, if a plurality of transistors 12 are not switched on, the voltage across load 38 is reduced by the sum of the voltages across the zener diodes 22 connected across the respective non-conducting transistors 12. The power dissipated in the zener diodes 22 during the pulse is equivalent to the zener voltage multiplied by the zener current multiplied by the duty cycle. The power lost in the zener string 20 during pulse off period can be kept to a minimum by limiting the current through the zeners diodes 22 to the lowest value necessary for proper zenering operation. This is accomplished by the current limiting resistor 30. Power lost through zener diode 36 can be minimized by selecting a low zenering voltage for zener diode 36.

Thus, selection of the proper value for limiting resistor 30 is important in the reduction of wasted power in the modulator. Zener diode 36, establishes a zero voltage across load 38 during the OFF cycle part of the duty cycle and in connection with resistor 30 permits establishment of quiescent voltages across the individual transistors 12 with no current flow through load 38 during the OFF part of the cycle. When the transistors 12 turn on, ideally they are turn on simultaneously, diode 36 permits a very rapid rise time for the switching on modulator pulse which is derived cross terminals 40. In this way, the quiescent current and voltage dissipation in the load resistor 38 is negligible and the rise time and the fall time of the switching pulse is improved.

The numbers of transistor and zener diodes in their respective strings 11, 20 can be indefinitely long in order to meet the voltage and current requirements for producing a particular modulator power. Additionally, a plurality or transistors can be placed in parallel for each of the transistors 12 shown for increasing the current carrying capability of each switch and also increasing the power dissipation capability of each switch. The numbers or transistors 12 turned on during a modulation pulse is determined externally by computer decision in order to achieve the regulation of the output pulse which is required.

In the exemplary embodiment, the FET transistors used were HEXFET TM transistors made by International Rectifier Corporation, and are power MOSFET transistors of a series IRF450-453 which have a maximum $V_{DS}$ of 500 V, $R_{D(ON)}$ of 0.4 ohms, and $I_D$ of 13 amperes, 52 amperes pulsed. It is anticipated that FET's having upgraded specifications can be used when they are made available, and in such an event, the numbers of transistors used in switching can be reduced accordingly, which would be a readily determined engineering decision.

Figure 2:
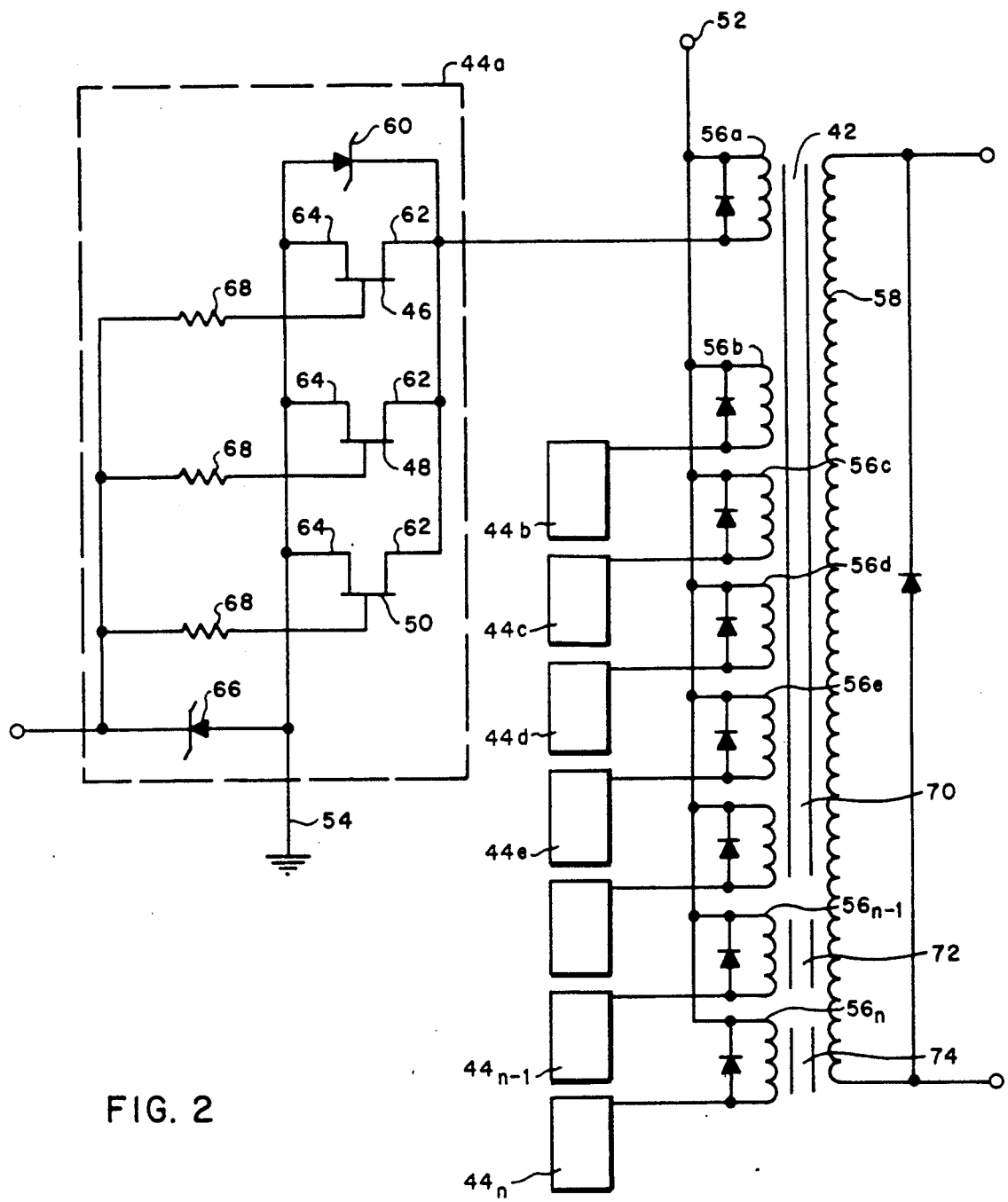
FIG. 2 is a schematic diagram of a second embodiment or the present invention.

Referring now to FIG. 2 there is shown an alternate embodiment of circuit for simultaneously combining the power of a large number of transistors for a microwave switching modulator. A transformer 42 sums the voltages from a string or transistor modules 44 by magnetic flux addition. The makeup of an individual module 44 is shown in module 44a and comprises a parallel field effect transistors 46, 48, and 50 as discussed above in connection with the embodiment of FIG. 1. Each parallel group of transistors switch the supply voltage at terminals 52 and 54 across a respective one of the primary windings 56 of transformer 42 when they conduct (ON). The voltage which appears across the secondary 58 of transformer 42 is the sum of all individual primary voltages multiplied by the turns ratio of transformer 42. The secondary current is equivalent to each primary current divided by the transformer turns ratio. A protective zener diode 60 protects the respective modules 44 from any high voltage transcients that might appear from the drain to source terminals 62, 64 of the transistors 46, 48, 50. Gate to source zener diodes 66 protect the transistors from input voltages in excess of their ratings. Gate resistors 68 protect against induced currents which could unintentionally trigger the transistors. Voltage regulation is achieved by not triggering some of the modules 44. This decreases the transformer secondary voltage at 58 by the voltage across terminals 52, 54 multiplied by the transformer turns ratio.

Transformer 42 is a special pulse transformer. The output current is regulated by a pulse adjustment of the transformer output voltage. The output voltage is controlled by the number of modules 44 active in the transformer primary circuits A logic circuit (not shown) monitors the power supply voltage and the RF frequency to be transmitted just prior to a transmitted pulse and determines how many transistor modules 44 must be pulsed to produce the desire modulation current.

In the exemplary embodiment, transformer 42 has 10 independent primary magnetic circuits each consisting of a pair of individual Permalloy 80C cores. The transformer secondary winding is wound upon all of the cores and links all 10 magnetic circuits. Each magnetic circuit has its own individual primary winding which is driven by an appropriate number of power field effect transistors in parallel. For such a transformer the secondary output voltage will be:

$$V = -N\frac{d\phi}{dt} = -N\sum_{k=1}^{K} A_k \frac{dB_k}{dt}$$

where:
N = number of secondary turns
$\phi$ = total secondary flux
$A_k$ = cross section of the kth magnetic circuit
$B_k$ = magnetic induction of the kth magnetic circuit
K = total number of magnetic circuits
If all $A_k$ and $B_k$ are the same then:

$$V = -NKA_k \frac{dB_k}{dt}$$

If:
V = 13 kv
$dB_k$ = 5k gauss
dt = 100 μseconds
$A_k$ = 1 in² = 6.45 cm²
K = 10 then the secondary winding requires 403 turns.

The voltage on the transistors must remain below 500 volts which is the peak rated voltage of the transistors used as stated hereinabove. Since the output voltage to the transistor voltage is about 30 to 1, and there is a 10 to 1 ratio in the secondary to primary core area as shown above, there needs to be a 3 to 1 turns ratio between the secondary and each of the primaries. For such an embodiment, the primaries will have about 135 turns and require a 430 volt, 70 amp pulse. This will require 2 transistors in parallel since the maximum $I_d$ or the transistors used is 52 amperes pulse.

The physical construction of such a transformer will have a fair amount of leakage inductance. This could effect the shape of the output pulse and the radar transmitter's performance The transformers output pulse should have a fast rise time and fall time, and a flat top. This requires the transformer to have a broad frequency response. To achieve this in a pulse step-up transformer requires a low leakage inductance and a low secondary winding capacity. A poor pulse shape at the transmitter will cause the RF amplitude and phase variations of the transmitter output during the pulse.

Using the formula above, since the required dynamic range of the output voltage is only 10% of the pulse amplitude, a transformer can be built with 90% of the total core area common to one primary and the secondary winding. The remaining 10% to the core area would be split into individual flux paths. This would permit a more conventional construction of most of the transformer which may result in a lower leakage conductance.

The output voltage is effected not only by the number of primary windings driven but also by the terminating impedance at the primary windings. The output current will try to minimize the total flux change in all of the cores linking the secondary winding. If a primary winding is unterminated while not driven, flux in the reverse direction is easily established in its magnetic path. This will subtract from the total flux driving the secondary winding. A reverse voltage pulse will appear at the unterminated primary winding. Shorting the undriven primary winding will prevent changing the flux in the undriven magnetic circuit without detrimentally effecting the flux in the other independent primary windings.

The sum of the input primary voltages is accomplished by flux addition The voltages across the transformers primaries are summed through the transformer action and appear across the secondary output. The output voltage is equal to the number or transformer primaries times the supply voltage times the transformer turns ratio. Output current is equal to each primary current divided by the transformer turns ratio. The output voltage is regulated by controlling the power from the supply voltage to one or more primary windings. The output voltage drops by the supply voltage times the transformer turns ratio for each primary not supplied with power during the pulse For this purpose, two transformer designs are possible. One transformer design uses a single secondary core to sum the flux of all of its multiple primary cores. The secondary is wound on this core and is common to all of the primaries. This type of voltage summing transformer is easy to construct, has minimum flux leakage, the efficiencies approach that or conventional pulse transformers, and is capable of very fast (less than 300ns) rise times for very high power outputs (approximately 3.8MW).

Such a single core multiple primary transformer will voltage regulate in the manner previous described when one or more of its primaries does not receive input power. However transformer current is less well behaved than the voltage. Current spikes are produced at primaries not receiving power and these spikes can be several times greater than the maximum pulse current normally present in the transformers primary. Additional surges in current are produce in primaries electrically adjacent to the one not receiving power. These current surges could easily exceed the safe operating limits of the field effect transistors.

The alternate transformer design employs a string of multiple pulse transformers whose secondary is common and whose primaries are fed power individually from separate switching modules. The flux in a transformer of this construction travels through separate cores. Voltage regulation is achieved by preventing some primaries from receiving power as in the above transformer design. A transformer of multicore construction does not have the current spike and current surges during regulation as does the single core transformer which provides a modular construction for ease in repair. Current decreases in all primaries during voltage regulation.

Multicore pulse transformers are harder to build than single core types in that they have higher leakage and losses associated with their interconnections. One possible construction for a multicore transformer is a series arrangement of individual pulse transformers. Each pulse transformer primary is connected separately to a control module The secondaries of each pulse transformer are connected in series to an adjacent transformer. In such a case the current characteristics on the voltage regulation are satisfactory. Such a transformer is predictable in its pulse response, its performance characteristics approach those of conventional single primary single secondary pulse transformers, and the modular arrangement facilitates ease or repair.

The pulse transformer shown in FIG. 2 combines the best attributes of the two types of construction of pulse transformer discussed hereinabove. The transformer of FIG. 2 has a non-regulating part which is a single multi-primary transformer on which is wound windings 56a, b, . . . about core 70. This transformer type has less leakage inductance and distributed capacitance than a string individual transformers. The regulating part of the pulse transformer is shown in windings 56 $n-1$ and 56 $n$ wound upon cores 72 and 74 which are discontinuous with core 70 and which form the regulating part of the pulse transformer. Windings 56$n-1$ and 56$n$ have their secondaries in series and their primarys separate. Thus in the operation of this hybrid transformer, current behavior is in accord with the circuit core transformer type. No current spikes or voltage surges are produce as long as the primaries on the separate cores are the ones controlling the transformers regulation.

Thus, there is presented a solid state modulator for microwave radar transmitters wherein one embodiment thereof, a string of transistors are series connected and individually switchable for producing a regulated pulse output to the transmitter. In another embodiment, a pulse transformer using a flux summing construction is used wherein the multiple primary windings are individually switchable with the secondary output being the summation of individual primary voltages times the turns ratio of the transformer.

While there has been illustrated and described what is at present considered to be a preferred embodiment of the present invention, it will be appreciated that numerous changes and modifications are likely to occur to those skilled in the art and it is intended in the appended claims to cover all of those changes and modifications which fall within the true spirit and scope of the present invention.

What is claimed is:

1. A switching modulator comprising:
    at least one switchable first devices, each of said first devices having an input terminal, an output terminal, and a control terminal controllable from an external means, the switchable first devices being connected in series with each other with the input terminal of one of the first devices being connected to the output terminal of another of the first devices forming a string of devices having a first and second terminal, the first devices being switchable between a conducting state and a non-conducting state by control of the control terminals,
    at least one second devices each connected across a respective one of the switchable first devices, the second devices providing a first voltage across the respective first devices when said first devices are in a non-conducting state and limiting the voltage appearing across the respective first devices when a voltage of greater magnitude than the first voltage is attempted to be impressed across the respective switchable first device,
    means for providing electrical power of a first and second polarity to the string of first and second devices for energizing the second devices for providing the first voltage,
    a series circuit comprising a connectable external load and a voltage dependent switch connectable in series with each other, the series circuit being connected between the first terminal of the string and a first polarity of the external power source, the voltage dependent switch being switchable into a non-conducting state when the magnitude of the voltage impressed across the voltage dependent switch is below a threshold voltage and into a conducting state when the magnitude of the voltage impressed across the voltage dependent switch is greater in magnitude than the threshold voltage, and a current limiting resistor connected across the series circuit providing means for reducing the current through and power dissipation of the second devices when the string of first devices is in a nonconducting state.

2. The modulator of claim 1 wherein the control terminals are individually controllable for determining the number of devices switched for each switching cycle.

3. A switching modulator comprising:

at least one switchable first devices connected in series with each other forming a first series circuit, at least one second devices connected across a respective one of each of the switchable first devices for establishing a voltage across the respective ones of each of said first devices when the respective first device is in a non-conducting state and limiting the voltage across the respective first devices when a voltage of greater magnitude than the established voltage is impressed across the respective first device, means for energizing the at least one second devices for establishing the voltage, a second series circuit having a first and second terminal and comprising a connectable external load connectable in series with a voltage dependent switch, the first terminal being connected to one end of the first series and the second terminal being connectable to one polarity of an external power source, the other end of the first series circuit being connectable to the other polarity of the external power source, and a current limiting resistor connected across the second series circuit providing means for reducing the current through and power dissipation of the second devices when the first devices are in a nonconducting state.

4. The modulator of claim 3 wherein the switchable first devices are individually controllable for determining the number of first devices switched for each switching cycle.

5. A regulated switching modulator comprising:

at least one switchable first devices connected in series with each other, each of the first devices having in input terminal, an output terminal, and a control terminal controllable from an external means, each of the switchable devices being singly controllable switchable between a conducting and nonconducting state by actuation of the control terminal of the respective switching device independent of the other switchable first devices, at least one second devices each connected across a respective one of each of said first devices for providing voltage across the respective one of said switchable first devices when said switchable devices are in a nonconducting state and limiting the voltage across the respective switchable first device when a voltage of greater magnitude than the provided voltage is impressed across said respective switchable first device, means for providing a first electrical power supply to the at least one second devices for energizing the second devices and having a first and a second polarity, and a series circuit comprising a connectable load and a voltage dependent switch connected in series with one other, the series circuit being connected in series with the at least one switchable first devices and connectable to one polarity of an external power supply, the series of at least one switchable first devices being connectable to the other polarity of the external power supply, the portion of the power supply applyable to the load being controllable by selective actuation of one of all and less than all of the control terminals for regulating the power provided the load terminals.

6. The regulated switching modulator of claim 5 wherein the power applyable to the load is regulated by the numbers of switchable first devices switched into the conductive state and adjustment to the duty cycle of the switching first devices in the conducting state.

7. The regulated switching modulator of claim 5 wherein the voltage applyable to the load is regulated by the numbers of the first device switched into the conducting state.

8. A regulated switching modulator comprising:

a multiple flux path transformer having at leat one primary windings and a secondary winding, each of the primary windings being wound on a separate flux path means so that the magnetic flux induced by current impressed upon each of the respective primary windings is additive to the magnetic flux of the secondary winding with the voltage generated in the secondary winding with the voltage sum of the components of the magnetic flux induced in the primary windings, at least one switchable devices each respectively connected to one of the primary windings for energizing the respective primary winding with power derived from an externally electrical power source, the magnitude of the voltage induced in the secondary winding being proportional to the numbers of switchable devices actuated, the switching devices being individually switchable for adjustable controlling the magnitude of the induced voltage in the secondary winding.

9. The modulator of claim 8 wherein the secondary voltage is regulated by selection of the numbers of switchable devices actuated.

* * * * *